(12) United States Patent
Maiden et al.

(10) Patent No.: US 9,467,199 B1
(45) Date of Patent: Oct. 11, 2016

(54) COMPRESSION USING MU-LAW APPROXIMATION

(71) Applicant: Altera Corporation, San Jose, CA (US)

(72) Inventors: Richard Maiden, Menlo Park, CA (US); Nima Safari, High Wycombe (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/669,881

(22) Filed: Mar. 26, 2015

Related U.S. Application Data

(60) Provisional application No. 62/017,076, filed on Jun. 25, 2014.

(51) Int. Cl.
*H04B 1/66* (2006.01)

(52) U.S. Cl.
CPC ...................................... *H04B 1/66* (2013.01)

(58) Field of Classification Search
CPC ...... H04N 7/50; H04N 19/40; H04N 19/423; H04N 19/436; H04N 19/61; H04B 1/66
USPC ................... 375/240, 240.23, 240.25, 240.02
See application file for complete search history.

(56) References Cited

U.S. PATENT DOCUMENTS

| | | | | |
|---|---|---|---|---|
| 5,041,830 A | * | 8/1991 | Abe | G06F 5/01 341/143 |
| 5,703,907 A | * | 12/1997 | James | H03M 7/30 341/106 |
| 2014/0355683 A1 | * | 12/2014 | Ling | H04N 19/51 375/240.16 |

OTHER PUBLICATIONS

"Common Public Radio Interface (CPRI); Interface Specification" *CPRI Specification V6.1* (Jul. 1, 2014) pp. 1-129.

* cited by examiner

*Primary Examiner* — Qutbuddin Ghulamali
(74) *Attorney, Agent, or Firm* — Fletcher Yoder, P.C.

(57) ABSTRACT

Techniques and mechanisms provide a technique for compression using an approximation of a mu-law algorithm.

20 Claims, 8 Drawing Sheets

| Input Data 415 | Exponent | Mantissa |
|---|---|---|
| 7 ←⎯ ...1xxxxxx... ⎯505a | 00 | abcde |
| 8 + offset ←⎯ ...1yyyyyy... ⎯505b | 01 | uvwxy |
| 9 + offset ←⎯ ...1zzzzzz... ⎯505c | 10 | mnopq |

Compressed Data 420 spans Exponent and Mantissa columns.

COMPRESSION USING MU-LAW APPROXIMATION

PRIORITY DATA

This patent document claims priority to commonly assigned U.S. Provisional Patent Application No. 62/017,076, titled "CPRI Compression using Multi-Segment Linear Approximation of Mu-Law", by Maiden et al., filed on Jun. 25, 2014, which is hereby incorporated by reference in its entirety and for all purposes.

TECHNICAL FIELD

This disclosure generally relates to compression using a mu-law approximation.

DESCRIPTION OF THE RELATED TECHNOLOGY

Data can be compressed by encoding the data in a new representation as compressed data. The compression algorithm used to encode the data into the compressed data may be a lossy algorithm that removes some information (e.g., bits). Accordingly, compressed data may have fewer bits than the original data, and therefore, may be faster to transmit or take less storage space.

Cellular data may be a type of data that is transmitted in wireless (e.g., cellular) systems. For example, a Long-Term Evolution (LTE) wireless communication standard may be used in a wireless system having a radio equipment controller (REC) providing baseband processing and radio equipment (RE) providing a radio for transmission of cellular data. The REC may communicate with the RE using an interface, such as Common Public Radio Interface (CPRI). CPRI may be implemented with compression using a mu-law (or μ-law) algorithm or A-Law. In particular, the mu-law compression may reduce the dynamic range of cellular data.

Accordingly, a designer may wish for an efficient implementation of compression using the mu-law algorithm.

SUMMARY

The subject matter described herein provides a technique for compression using an approximation of a mu-law algorithm.

In some scenarios, input data may need to be compressed when transmitted. In one implementation described herein, a circuit may provide an approximation of a mu-law compression algorithm to more efficiently encode the input data as compressed data. The circuit may provide the compressed data by generating an exponent portion and a mantissa portion for the compressed data. The exponent portion may be based on a value range that the value of the input data is within. The mantissa portion may be based on shifting the input data a certain number of bits based on the value of the exponent portion. Additionally, the mantissa portion may be summed with an offset if the value of the input data is within a particular value range. The exponent portion and mantissa portion may together provide the compressed data.

These and other features will be presented in more detail in the following specification and the accompanying figures, which illustrate by way of example.

BRIEF DESCRIPTION OF THE DRAWINGS

FIG. 5 is a chart illustrating generation of compressed data in accordance with some implementations.

DETAILED DESCRIPTION OF PARTICULAR EMBODIMENTS

The following examples illustrate embodiments implementing an approximation of mu-law (or μ-law) compression for cellular data. However, the techniques and methodologies disclosed herein may also be used in other types of compressions and other types of data.

Figure 1:
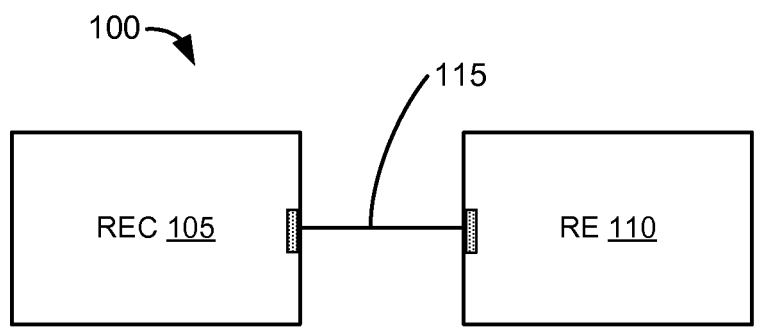
FIG. 1 illustrates an example of a wireless system in accordance with some implementations.

FIG. 1 illustrates an example of a wireless system in accordance with some implementations. In FIG. 1, wireless system 100 may be a cellular system implementing a wireless communication standard, such as Long-Term Evolution (LTE), Global System for Mobile Communications (GSM), etc. Wireless system 100 includes radio equipment controller (REC) 105 for baseband processing and radio equipment (RE) 110 for a radio used in the transmission of data. For example, REC 105 may be a baseband unit at a base of a cell tower and RE 110 may include a remote radio head on top of the cell tower. REC 105 and RE 110 may communicate through interface 115 which may be a physical medium, such as a fiber optic cable.

The data provided by REC 105 to RE 110 through interface 115 may include data provided using the Common Public Radio Interface (CPRI) standard. CPRI allows data through interface 115 to use a mu-law (or μ-law) compression algorithm to reduce the dynamic range of the data by generating compressed data. That is, the data may be encoded into compressed data using a mu-law algorithm that removes some bits such that the compressed data has fewer bits than the original data (i.e., a lossy algorithm). Accordingly, the compressed data requires less bandwidth to transmit between REC 105 and RE 110.

Figure 2:
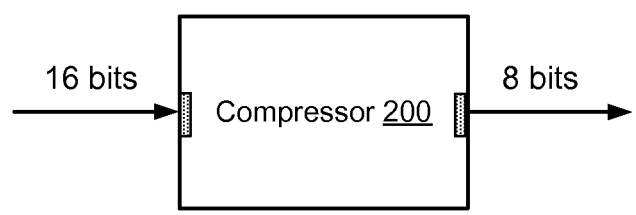
FIG. 2 illustrates an example of a compressor unit in accordance with some implementations.

FIG. 2 illustrates an example of a compressor unit in accordance with some implementations. Compressor 200 may implement the mu-law compression algorithm. For example, in FIG. 2, compressor unit 200 receives data having 16 bits (e.g., uncompressed data) and generates compressed data having 8 bits (e.g., compressed data) as a compressed representation of the 16 bit input. Compressor unit 200 may be implemented within REC 105, and therefore, the compressed data having less bits may be provided over interface 115 to RE 110. As a result, more data may be transmitted using interface 115 in the same amount of time if compression is used. In some implementations, when the compressed data is received by RE 110, a decompression unit within RE 110 may reconstruct the data back into a 16-bit representation from the 8-bit representation.

As previously discussed, the mu-law algorithm may be used in the compression of data by reducing the dynamic range of the data in the compressed data. For a given value, mu-law encodes the value using the equation $$F(x) = \text{sign}(x) \frac{\text{Log}_n(1 + \text{mu\_compand\_val}(x))}{\text{Log}_n(1 + x)},$$

where "mu_compand_val" controls a rate of expansion of the function using a constant (i.e., a mu-value).

Figure 3A:
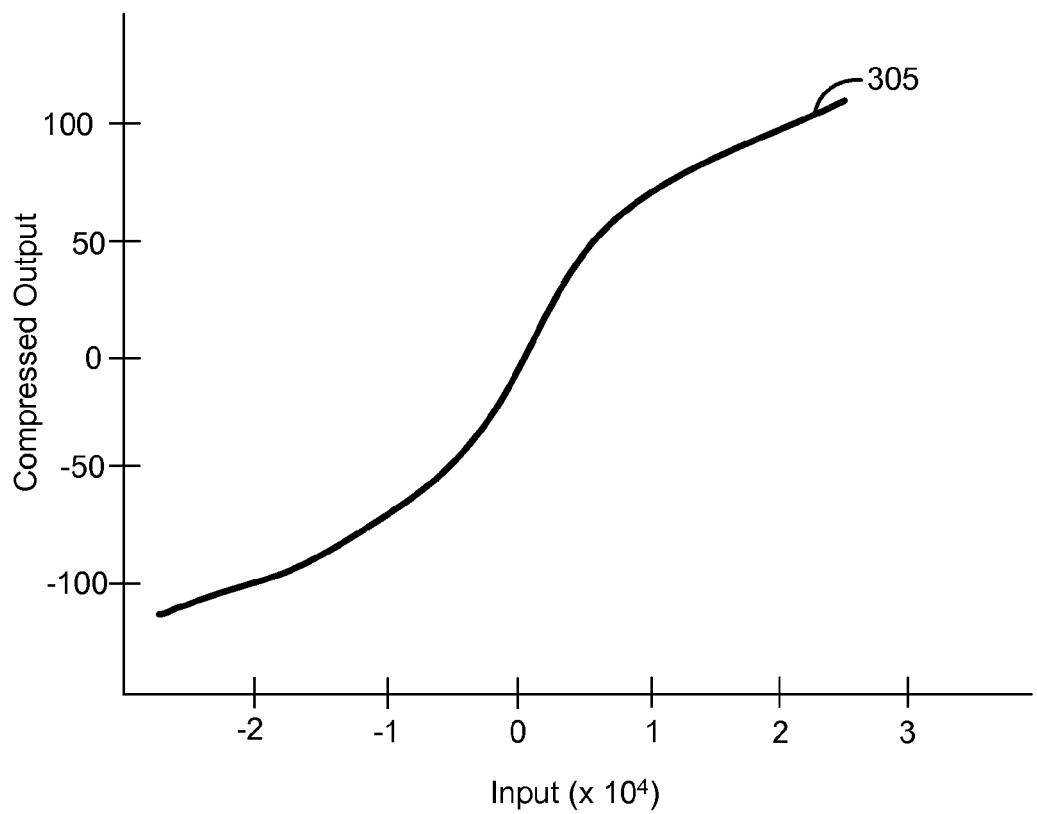
FIG. 3A illustrates an example of mu-law compression in accordance with some implementations.

Often, in audio applications, a high mu-value such as 255 may be used. FIG. 3A illustrates an example of mu-law compression in accordance with some implementations. In FIG. 3A, curve 305 illustrates the encoding between input values on the x-axis and the compressed values on the y-axis corresponding to the input values using a mu-value of 8 rather than 255. A mu-value of 8 rather than 255 provides curve 305 with a lower rate of expansion and provides an efficient encoding for cellular data.

In FIG. 3A, input values ranging from −32,768 (i.e., −$2^{15}$) to 32,768 (i.e., $2^{15}$) are encoded as compressed values ranging from −128 (i.e., −$2^7$) to 128 (i.e., $2^7$) based on curve 305. Accordingly, input values (e.g., the 16 bit inputs in FIG. 2) are redistributed across a compressed value range (e.g., the 8 bit compressed outputs in FIG. 2). As a result, curve 305 represents the redistribution of the input values to the compressed values.

However, the logarithmic operations needed to implement the mu-law algorithm can be resource intensive. Accordingly, an approximation may be used to reduce the amount of resources needed to perform the compression using the mu-law algorithm. For example, in a programmable chip such as a Field Programmable Gate Array (FPGA), using an approximation may use less logic resources. In an application specific integrated circuit (ASIC), less circuitry may need to be designed. Moreover, an approximation may be able to be performed faster while still providing useful data. Accordingly, an approximation of the mu-law algorithm may provide an efficient compression implementation that may be used by compressor unit 200.

Figure 3B:
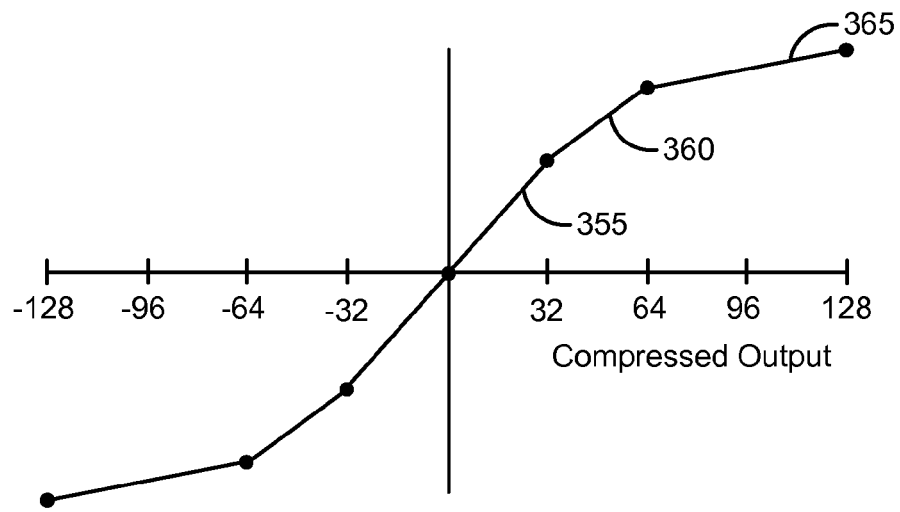
FIG. 3B illustrates an example of a mu-law approximation compression in accordance with some implementations.

FIG. 3B illustrates an example of a mu-law approximation compression in accordance with some implementations. In FIG. 3B, curve 305 in FIG. 3A may be approximated by six segments. Segments 355, 360, and 365 are in the positive x-axis portion of the curve. The three segments in the negative x-axis portion of the curve are mirrors of segments 355, 360, and 365 because the curve is symmetric around the origin of the graph (i.e., a copy of the top-right quadrant is "flipped" to the bottom-left quadrant). Accordingly, the curve in FIG. 3B provides a piecewise, segmented approximation of curve 305.

Segments 355, 360, and 365 indicate the encoding between input values and compressed values, similar to FIG. 3A. The x-axis of FIG. 3B shows the compressed values for the endpoints of segments 355, 360, and 365. In FIG. 3B, segment 355 has one endpoint at 0 and another endpoint at 32 on the x-axis, and therefore, segment 355 indicates the encoding for input values 0-8192 that are represented as compressed values in the range of 0-32. Segment 360 indicates the encoding for input values 8193-16384 that are represented as compressed values in the range of 32-64. Segment 365 indicates the encoding for input values 16385-32768 that are represented as compressed values in the range of 64-128. Accordingly, ¼ of the compressed values are represented by segment 355, ¼ of the compressed values are represented by segment 360, and ½ of the compressed values are represented by segment 365. Additionally, each of the segments has a different slope depending on the range of the input values and compressed values it represents the encoding for. For example, the slope of segment 355 may be higher than the slope of segment 360, and the slope of segment 360 may be higher than the slope of segment 365.

Figure 4:
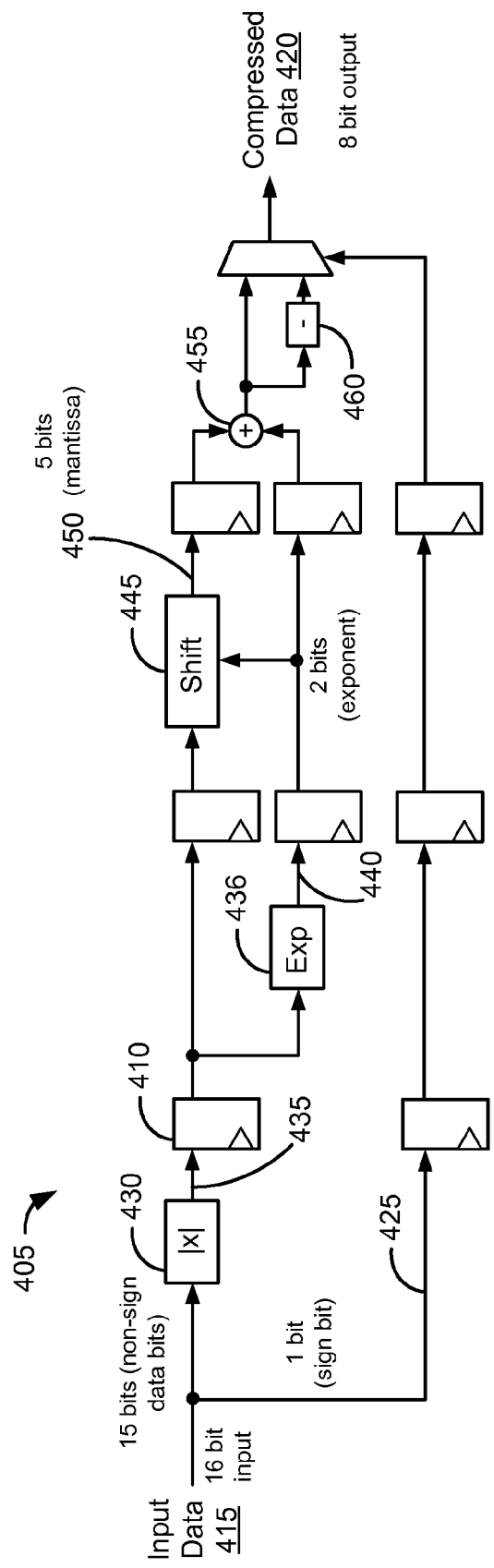
FIG. 4 illustrates an example of a circuit schematic for a mu-law approximation compression in accordance with some implementations.

FIG. 4 illustrates an example of a circuit schematic for a mu-law approximation compression in accordance with some implementations. Circuit 405 shows a pipeline providing a variety of logic units for implementing the mu-law approximation compression. However, circuit 405 may be modified to have a different number of pipeline stages (i.e., a different number of registers 410). For example, no registers 410 may be in between the various logic units of circuit 405.

Circuit 405 may perform an approximation of a mu-law compression by encoding 16 bit input data 415 as 8 bit compressed data 420. The 8 bits of compressed data 420 may include 2 bits as an exponent indicating which of segments 355, 360, or 365 the 8 bit compressed data 420 is associated with (indicating the value range of the input data). 5 bits of the 8 bits of compressed data 420 may be a mantissa based on the five most significant bits of the input data that is further encoded into the compressed data scheme. A final 1 bit may be used to indicate negative numbers in two's complement format.

For example, FIG. 5 is a chart illustrating generation of compressed data in accordance with some implementations. In FIG. 5, input data 415 is encoded as compressed data 420, as previously discussed. In some implementations, input data 415 and compressed data 420 may be provided in the two's complement format where the most significant bit is used to represent negative numbers. Accordingly, compressed data 420 includes 8 bits with 2 of the bits being the exponent and 5 of the bits being the mantissa, with the exponent and mantissa providing a representation of the value of compressed data 420. For example, the exponent and mantissa may be used in scientific notation representation of numbers. The other 1 bit for the indication of negative numbers in two's complement format and is not represented in FIG. 5.

For example, the exponent of compressed data 420 may be determined by the value range that input data 415 is within. In particular, which of segments 355, 360, or 365 is associated with the particular input data 415 value determines the exponent bits of compressed data 420. For example, if the value of input data 415 is between 0-8192, then segment 355 may indicate the particular encoding between input data 415 and compressed data 420. Accordingly, the exponent may be "00," as in the first row in the chart of FIG. 5, to indicate that the value of " . . . 1xxxxxx . . . " is associated with segment 355. Segments 360 and 365 may be represented by different values in the exponent, for example, "01" for segment 360 for input data values in a range of 8193-16384 (e.g., " . . . 1yyyyyy . . . ") and "10" for segment 365 for input data values in a range of 16385-32768 (e.g., " . . . 1zzzzzz . . . ").

The mantissa of compressed data 420 may represent the value of input data 415 following a bit shifting operation and an offset addition for values in certain ranges. For example, in the first row, once input data 415 is identified as being associated with segment 355, the mantissa may be provided by shifting 505*a* input data 415 by 7 bits to provide a mantissa of "abcde" in FIG. 5. In particular, shifting binary data by 7 bits provides a division by 128 (e.g., 8192 in binary shifted 7 bits is 64 in binary). The 5 most significant bits following the 7 bit shift operation may be provided as the mantissa data of compressed data 420 for the first row. Accordingly, in FIG. 5, input data 415 in the first row having a value of " . . . 1xxxxxx . . . " may be shifted by 7 bits to divide the input data value by 128 to provide a value of "abcde."

The values of input data 415 may be in ranges associated with segments 355, 360, and 365, and therefore, would be shifted different amounts. For example, to provide the mantissa for an input value 415 associated with segment 360, shift 505*b* may provide a shift of 8 bits (i.e., a division by 256). To provide the mantissa for an input value 415 associated with segment 365, shift 505*c* may provide a shift of 9 bits (i.e., a division by 512). As a result, each input value 415 may be compressed as compressed data 420 with an exponent value and a mantissa value. The exponent value may be determined by the particular segment 355, 360, and 365 associated with the value of input data 415 and the mantissa may be generated by shifting input data 415 a particular amount based on the determined exponent value.

Additionally, input data in the values ranged associated with segments 360 and 365 may include an offset added into the value of the mantissa following the bit shifting. For example, for an input value 415 associated with segment 360 and shift 505*b* that is shifted 8 bits (i.e., division by 256), an additional offset of 32 may be added to provide a mantissa of compressed data 420 in the second row of "uvwxy." For an input value 415 associated with segment 365 and shift 505*c* that is shifted 9 bits (i.e., a division by 512), an additional offset of 64 may be added. This may allow for an approximation of curve 305 as in FIG. 3B. In particular, the offsets represent the beginning points of segments 360 (i.e., beginning at a value of 32) and segment 365 (i.e., beginning at a value of 64) and allows for the encoding provided by the mu-law approximation in FIG. 3B.

Accordingly, in FIG. 4, 16 bit input data 415 is received by circuit 405. The 1 bit sign value 425 of input data 415 may be split from the rest of the input data 415 (e.g., by routing its interconnect) and provided to a register to store and used later as described below. The remaining 15 bits of input data 415 may be provided to absolute value unit 430 to convert the 15 bits of input data 415 into an unsigned binary representation, for example, by converting the two's complement negative numbers into non-signed binary numbers such that the negative values in two's complement are represented by the same bits as positive binary numbers in two's complement. This may be performed because the approximation of curve 305 in FIG. 3B is symmetric around the origin, and therefore, negative and positive values may be treated similarly (and therefore save resources) by circuit 405 and the sign bit and any necessary conversion may be performed later, as described below. Accordingly, input data 435 is provided by absolute value unit 430.

Next, exponent determination unit 436 may be determine exponent data 440, as previously discussed, for example, by determining the value range of input data 435. Accordingly, exponent determination unit 436 may provide a 2 bit value (e.g., "00," "01," or "10") associated with a particular segment 355, 360, or 365, as previously discussed.

In the next pipeline stage, shift register 445 may shift input data 435 a particular amount based on the value of exponent data 440 to provide the next significant bits as mantissa data 450. For example, as previously discussed, exponent data 440 may have a value of "00," "01," or "10" depending on whether the value of input data 435 is in a range corresponding with segments 355, 360, or 365, respectively. In the example disclosed herein, if exponent data value has a value of "00" indicating segment 355, then input data 435 may be shifted by 7 bits to generate mantissa data 450. If the value of input data 435 is in a different range, for example in a range associated with segment 360, then input data 435 may be shifted another amount to generate mantissa data 450, for example, by shifting input data 435 by 8 bits. Moreover, if the value of input data 435 is in a range associated with segments 360 or 365, then an offset of 32 or 64, respectively, may be added following the bit shifting operation, as previously discussed.

After mantissa data 450 is determined, it may be combined with exponent data 440 by compressed data unit 455 to form a 7 bit compressed data corresponding to the original 16 bit input data. For example, the 2 bits of exponent data 440 may be the more significant bits of the 7 bit compressed data than the 5 bits of mantissa data 450. Compressed data unit 455 may then add an eighth bit as a sign bit indicating a positive number in two's complement. Negative compressed data unit 460 may take the 8-bit compressed data generated by compressed data unit 455 and generate a negative equivalent of the positive number in two's complement. Mux 465 may then select the appropriate positive or negative two's complement number based on sign value 425. For example, if sign value 425 indicates that input data 415 was a positive number, then the output of compressed data unit 455 may be provided as compressed data 420. If sign value 425 indicates that input data 415 was a negative number, then the output of negative compressed data unit 460 may be provided as compressed data 420.

Though the preceding example uses a 2 bit exponent indicating the segment associated with the range of input data 415, in other implementations, more or less bits may be used for the exponent. For example, exponent data 440 may be 3 bits and mantissa data 450 may be 4 bits. Exponent data 440 may have additional bits if more than four segments are used to approximate curve 305. Additionally, how much input data 435 is shifted by shift register 445, which direction the shifting is performed, and the amount of offsets may also be changed to suit different approximations.

Figure 6:
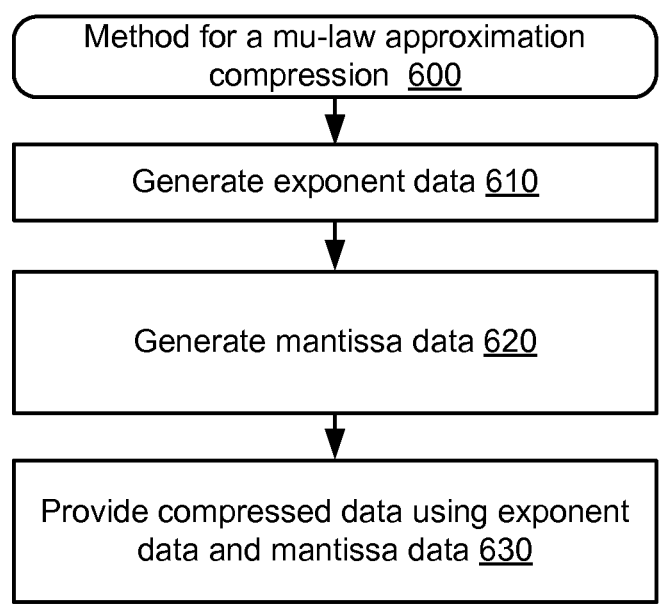
FIG. 6 is a flowchart illustrating a process flow for a mu-law approximation compression in accordance with some implementations.

FIG. 6 is a flowchart illustrating a process flow for a mu-law approximation compression in accordance with some implementations. In method 600, at block 610, exponent data for the compressed data may be generated from the input data. For example, the value range of the input data may be analyzed and the exponent data may be generated based on the value range. At block 620, mantissa data may be generated for the compressed data. For example, the input data may be shifted a particular number of bits based on the value of the exponent data. Moreover, for some exponent data values, an extra offset may be added to approximate the mu-law algorithm. At block 630, the compressed data may be provided using the exponent data and the mantissa data.

Figure 7:
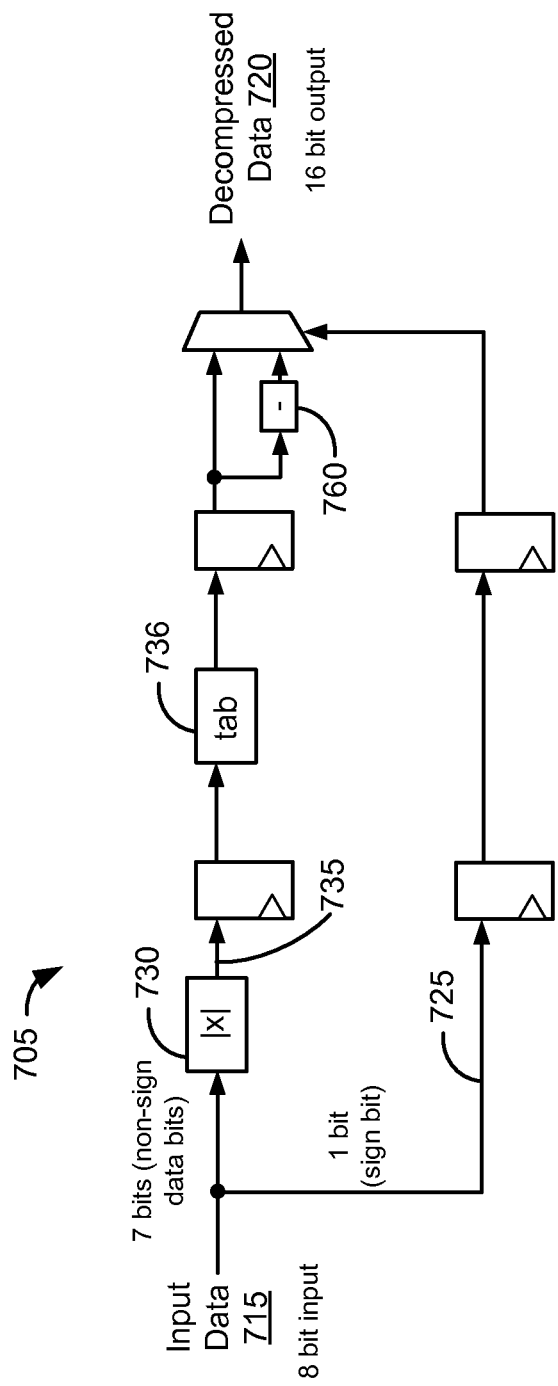
FIG. 7 illustrates an example of a circuit schematic for a decompression circuit in accordance with some implementations.

The preceding example describes a mu-law compression algorithm that may be implemented within compressor unit 200. The inverse may also be performed in a decompressor unit. For example, 8 bit compressed data 420 may be decompressed into a lossy input data 415 by performing an inverse of the mu-law compression algorithm. For example, the 8 bit compressed data 420 may be decompressed into a 16 bit number closely approximating the original 16 bit input data 415 (e.g., due to losing some precision due to the compression process being a lossy algorithm). FIG. 7 illustrates an example of a circuit schematic for a decompression circuit in accordance with some implementations.

In FIG. 7, a compressed 8 bit input data 715 is received by circuit 705. The 1 bit sign value 725 may be split from the rest of input data 415 and provided to a register to be stored and used later, similar to the compression circuit of FIG. 4. The remaining 7 bits 735 (indicating the exponent and mantissa) may be provided to absolute value unit 430 to convert the 7 bits of input data 715 into an unsigned binary representation. Next, decompression table 736 may be able to perform a reverse of exponent unit 436 in FIG. 4. For example, input data 715 may include the exponent and mantissa as indicated in FIG. 5 and decompression table 736 may provide the corresponding 15 bit decompressed data (with some imprecision, as previously discussed), for example, by implementing a table providing for the 7 bit to 15 bit decompression by looking up the corresponding 15 bit value for the 7 bits 735. The example of FIG. 7 implements a table for the decompression because it may be easier and faster to provide for decompression by looking up the corresponding 15 bit output for the 7 bit inputs. The 15 bit decompressed data may be provided in 16 bit positive and negative values (e.g., negative provided by negative decompression data unit 760) and the positive or negative value is selected based on sign value 725 to generate 16 bit decompressed data 720 from the 8 bit input data 715.

The examples herein portray compression and decompression from one bit count to another bit count (e.g., 16 bits compressed to 8 bits), but any other bit count may be used.

In some implementations, circuit 405 and circuit 705 may be implemented in a programmable chip. For example, a designer may use an electronic design automation (EDA) software tool and select an Intellectual Property (IP) core representing a reusable unit of logic (e.g., circuit 405) that may be integrated into the designer's design. In other implementations, circuit 405 may be implemented in an application specific integrated circuit (ASIC) or other type of device.

Figure 8:
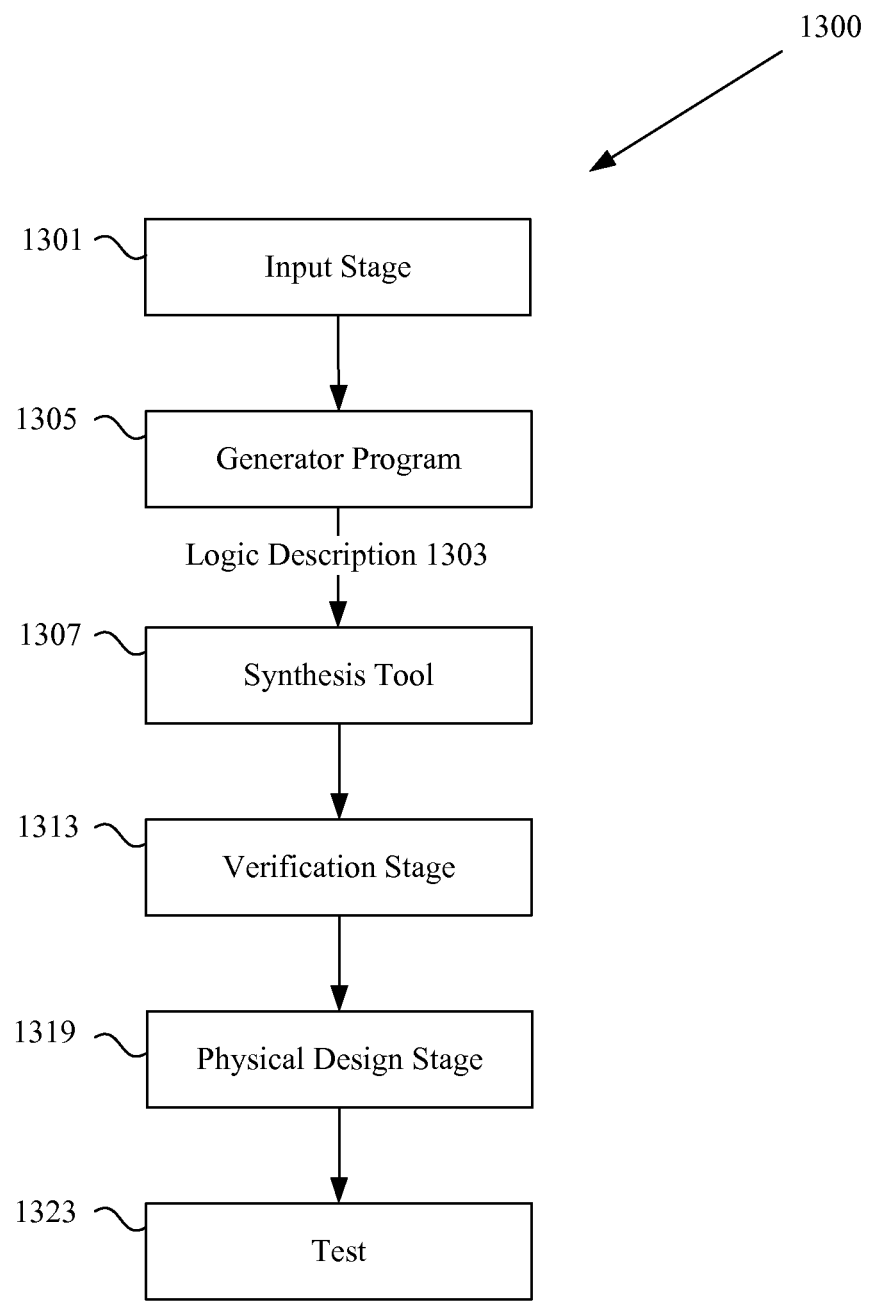
FIG. 8 illustrates a technique for implementing a programmable chip.

FIG. 8 illustrates a technique for implementing a programmable chip. An input stage 1301 receives selection information typically from a user for logic such as a processor core as well as other components to be implemented on an electronic device. In one example, the input received is in the form of a high-level language program. A generator program 1305 creates a logic description and provides the logic description along with other customized logic to any of a variety of synthesis tools, place and route programs, and logic configuration tools to allow a logic description to be implemented on an electronic device.

In one example, an input stage 1301 often allows selection and parameterization of components to be used on an electronic device. The input stage 1301 also allows configuration of hard coded logic. In some examples, components provided to an input stage include intellectual property functions, megafunctions, and intellectual property cores. The input stage 1301 may be a graphical user interface using wizards for allowing efficient or convenient entry of information. The input stage may also be a text interface or a program reading a data file such as a spreadsheet, database table, or schematic to acquire selection information. The input stage 1301 produces an output containing information about the various modules selected. At this stage, the user may enter security information about individual components that needs to be isolated. For example, different levels of component security and which components are allowed to communicate with each other may be entered.

In typical implementations, the generator program 1305 can identify the selections and generate a logic description with information for implementing the various modules. The generator program 1305 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1305 identifies pointers and provides ports for each pointer. Tools with generator program capabilities include System on a Programmable Chip (SOPC) Builder and QSys available from Altera Corporation of San Jose, Calif. The generator program 1305 also provides information to a synthesis tool 1307 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1301, generator program 1305, and synthesis tool 1307 can be separate programs. The interface between the separate programs can be a database file, a log, or simply messages transmitted between the programs. For example, instead of writing a file to storage, the input stage 1301 can send messages directly to the generator program 1305 to allow the generator program to create a logic description. Similarly, the generator program can provide information directly to the synthesis tool instead of writing HDL files. Similarly, input stage 1301, generator program 1305, and synthesis tool 1307 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1307.

A synthesis tool 1307 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1313 typically follows the synthesis stage 1307. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1313, the synthesized netlist file can be provided to physical design tools 1319 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1323.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1301, the generator program 1305, the synthesis tool 1307, the verification tools 1313, and physical design tools 1319 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 9:
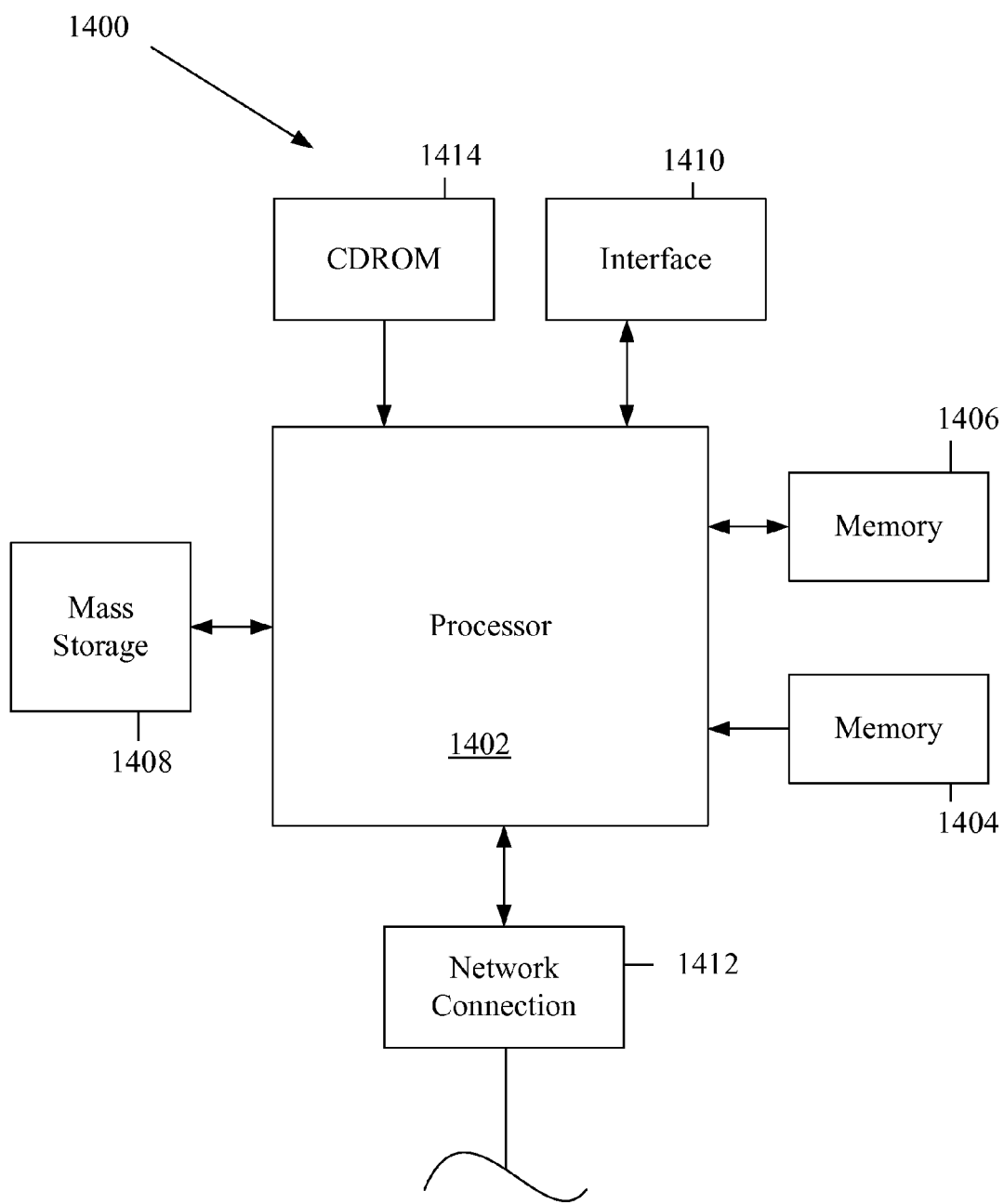
FIG. 9 illustrates one example of a computer system.

FIG. 9 illustrates one example of a computer system. The computer system 1400 includes any number of processors 1402 (also referred to as central processing units, or CPUs) that are coupled to devices including memory 1406 (typically a random access memory, or "RAM"), memory 1404 (typically a read only memory, or "ROM"). The processors 1402 can be configured to generate an electronic design. As is well known in the art, memory 1404 acts to transfer data and instructions uni-directionally to the CPU and memory 1406 are used typically to transfer data and instructions in a bi-directional manner.

Both of these memory devices may include any suitable type of the computer-readable media described above. A mass storage device 1408 is also coupled bi-directionally to CPU 1402 and provides additional data storage capacity and may include any of the computer-readable media described above. The mass storage device 1408 may be used to store programs, data and the like and is typically a secondary storage medium such as a hard disk that is slower than memory. The mass storage device 1408 can be used to hold a library or database of prepackaged logic or intellectual property functions, as well as information on generating particular configurations. It will be appreciated that the information retained within the mass storage device 1408, may, in appropriate cases, be incorporated in standard fashion as part of memory 1406 as virtual memory. A specific mass storage device such as a CD-ROM 1414 may also pass data uni-directionally to the CPU.

CPU 1402 is also coupled to an interface 1410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1402 may be a design tool processor. Finally, CPU 1402 optionally may be coupled to a computer or telecommunications network using a network connection as shown generally at 1412. With such a network connection, it is contemplated that the CPU might receive information from the network, or might output information to the network in the course of performing the above-described process steps. It should be noted that the system 1400 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A compression circuit to receive input data and generate compressed data based on the received input data, the compression circuit to generate the compressed data to have a first portion and a second portion, the first portion having a first value representing a value range of the received input data, the second portion having a second value associated with a bit shifting operation of the received input data, the bit shifting operation based on the first value of the first portion.

2. The compression circuit of claim 1, wherein the first portion of the compressed data represents an exponent and the second portion of the compressed data represents a mantissa.

3. The compression circuit of claim 1, wherein a number of bits shifted in the bit shifting operation is based on the first value of the first portion.

4. The compression circuit of claim 1, wherein the compression circuit is further to add an offset to the bit shifted received input data.

5. The compression circuit of claim 4, wherein the offset is based on the first value of the first portion.

6. The compression circuit of claim 1, wherein the compression circuit is further to generate a positive representation and a negative representation of the compressed data.

7. The compression circuit of claim 6, wherein the compression circuit is further to select between the positive representation and the negative representation of the compressed data based on the received input data.

8. A circuit receiving input data and providing compressed data, the circuit comprising:
- a first logic unit to determine a first portion of the compressed data representing a value range of the input data; and
- a second logic unit to determine a second portion of the compressed data based on a value of the first portion.

9. The circuit of claim 8, wherein the first portion represents an exponent of the compressed data and the second portion represents a mantissa of the compressed data.

10. The circuit of claim 8, wherein the second portion of the compressed data is based on the input data being shifted by a shift register by a number of bits based on the value range of the input data.

11. The circuit of claim 10, wherein the second portion of the compressed data includes an offset based on the value range of the input data.

12. The circuit of claim 11, wherein the shifted input data is summed with the offset to provide the second portion.

13. The circuit of claim 10, wherein different value ranges of the input data indicate a different number of bits of the input data to be shifted.

14. The circuit of claim 13, wherein different value ranges of the input data indicate different offsets to be summed with the shifted input data.

15. A method for receiving input data and approximating a compression algorithm to provide compressed data, the method comprising:
- generating exponent data as a first portion of the compressed data representing a value range of the input data;
- generating mantissa data as a second portion of the compressed data based on a value of the first portion; and
- providing the first portion and the second portion as the compressed data.

16. The method of claim 15, wherein the second portion of the compressed data is based on the input data being shifted by a shift register by a number of bits based on the value range of the input data.

17. The method of claim 16, wherein different value ranges of the input data indicate a different number of bits of the input data to be shifted.

18. The method of claim 17, wherein different value ranges of the input data indicate different offsets to be summed with the shifted input data.

19. The method of claim 15, wherein the second portion of the compressed data includes an offset based on the value range of the input data.

20. The method of claim 19, wherein the shifted input data is summed with the offset to provide the second portion.

* * * * *